United States Patent [19]
Schmidt et al.

[11] Patent Number: 6,058,010
[45] Date of Patent: May 2, 2000

[54] ENHANCED TEST HEAD LIQUID COOLED COLD PLATE

[75] Inventors: Roger R. Schmidt; William P. Maclachlan, both of Poughkeepsie; Drew R. Horvath, Red Hook; Dennis R. Barringer, Wallkill, all of N.Y.

[73] Assignee: International Business Machines Corporation, Armonk, N.Y.

[21] Appl. No.: 09/188,055

[22] Filed: Nov. 6, 1998

[51] Int. Cl.$^7$ ...................................................... H05K 7/20
[52] U.S. Cl. .......................... 361/689; 361/699; 361/700; 361/704; 361/707; 361/719; 174/15.1; 174/15.2; 165/80.4
[58] Field of Search ................................... 361/683–697, 361/700–704, 715, 719, 720, 796; 165/80.4, 104.33, 185; 174/15.2, 16.3; 62/259.2

[56] References Cited

U.S. PATENT DOCUMENTS

| | | | |
|---|---|---|---|
| 3,631,325 | 12/1971 | Wenz | 361/705 |
| 4,044,396 | 8/1977 | Haws et al. | 361/698 |
| 4,951,740 | 8/1990 | Peterson et al. | 165/276 |
| 5,088,005 | 2/1992 | Ciaccio | 361/699 |
| 5,247,424 | 9/1993 | Harris et al. | 361/704 |
| 5,268,814 | 12/1993 | Yakubowski | 361/704 |
| 5,283,715 | 2/1994 | Carlsten et al. | 361/702 |
| 5,794,454 | 8/1998 | Harris et al. | 62/259.2 |

Primary Examiner—Leo P. Picard
Assistant Examiner—Boris Chervinsky
Attorney, Agent, or Firm—Floyd Gonzalez; Cantor Colburn LLP

[57] ABSTRACT

A cold plate, planar in shape, is machined to provide an interior cavity having a plurality of thermally conductive members which transfer any thermal energy absorbed by the cold plate to a chilled water stream flowing through the interior cavity. Electronic cards are mechanically and thermally married to copper conduction plates which mount on a surface of the cold plate. The cold plate can hold up to nineteen pairs of conduction plate/electronic card assemblies. Thermal energy generated by the electronic circuit cards flows into the conduction plate and then into the chilled water stream flowing in cold plate. The chilled water is provided by a cooling system as known in the art. The cold plate also provides a large central through-hole through which the electronic cards are electrically connected to a computer system. The cold plate through-hole allows the cold plate to enjoy close proximity to the thermal source providing a path of high conductance for the thermal energy to be dissipated.

20 Claims, 9 Drawing Sheets

14

14

17

17

ENHANCED TEST HEAD LIQUID COOLED COLD PLATE

BACKGROUND OF THE INVENTION

1. Field of the Invention

The present invention is generally directed to providing reliable cooling systems for computer systems or for any electronic system requiring cooling. More particularly, the present invention is directed to the cooling of an enhanced test head which contains a very dense electronic package designed for test equipment manufacturers to test both logic and memory packaged products.

2. Prior Art

The test head electronics are required to perform these tasks in the shortest possible time and therefore particularly high heat fluxes are generated in the electronic package. Innovative solutions are necessary to handle these high heat fluxes and still maintain the integrated circuits within temperature specifications.

A typical test head preferably occupies a 15"×30"×30" volume and generates approximately 8,000 watts of heat. This heat flux must be continually removed from this small volume to maintain integrated circuit temperatures at acceptable levels. To convey this heat from the test head an enhanced cold plate mated through conduction cooling to the electronic cards was developed.

A refrigeration system employing a single cold plate which preserves flow isolation between the fluids in the redundant systems. In another aspect of the present invention, there is provided a combination of air and redundant refrigeration cooling for an electronic device such as a mainframe or server processing unit disposed within a cabinet possibly along with other less thermally critical components. In yet another aspect of the present invention, there is provided additional cold plates, each with its own array of electronic circuit cards to be cooled. The entire assembly is mounted on an articulated arm for movement to and from multiple test sites. The enhanced test head is capable of operating continuously in a variety of ambient conditions and under a variety of thermal loads.

In recent years, the semiconductor industry has taken advantage of the fact that CMOS circuits dissipate less power than bipolar circuits. This has permitted more dense packaging and correspondingly faster CMOS circuits. However, almost no matter how fast one wishes to run a given electronic CMOS circuit chip, there is always the possibility of running it faster if the chip is cooled and thermal energy is removed from it during its operation. This is particularly true of computer processor circuit chips and even more particularly true of these chips when disposed within multi-chip modules which generate significant amounts of heat. Because there is a great demand to run these processor modules at higher speeds, the corresponding clock frequencies at which these devices must operate become higher. In this regard, it should be noted that it is known that power generation rises in proportion to the clock frequency. Accordingly, it is seen that the desire for faster computers generates not only demand for computer systems but also generates thermal demands in terms of energy which must be removed for faster, safer and more reliable circuit operation. In this regard, it is to be particularly noted that, in the long run, thermal energy is the single biggest impediment to semiconductor operation integrity.

In addition to the demand for higher and higher processor speeds, there is also a concomitant demand for reliable computer systems and electronics. This means that users are increasingly unwilling to accept down time as a fact of life. This is particularly true in the demanding high pressure environment of electronic test equipment. Reliability in air-cooled systems is relatively easily provided by employing multiple air-moving devices (fans, blowers, etc.). Other arrangements which incorporate a degree of redundancy employ multiple air-moving devices whose speeds can be ramped up in terms of their air delivery capacity if it is detected that there is a failure or need within the system to do so. However, desired chip-operating power levels are nonetheless now approaching the point where air cooling is not the ideal solution for all parts of the system in all circumstances. While it is possible to operate fans and blowers at higher speeds, this is not always desirable for acoustic reasons. Accordingly, the use of direct cooling through the utilization of a refrigerant and a refrigeration system becomes more desirable, especially if faster chip speeds are the goal.

While certain electronic components or modules produce relatively large amounts of thermal energy, it is often the case that these modules are employed in conjunction with other electronic circuit components which also require some degree of cooling but do not operate at temperatures so high as to require direct cooling via a cold plate and/or refrigerant system. If modules of varying thermal energy output are employed in the same system, it is therefore desirable that the cooling systems employed for the lower thermal output modules be cooled in a manner which is compatible with cooling systems employed for the higher temperature modules. To the extent that a degree of cooperation between these systems can be provided, the net result is a system which is even more reliable and dependable. Nonetheless, these dual cooling modalities may be accommodated within a single electronic card assembly.

There are yet other requirements that must be met when designing cooling units for computer systems, especially those which operate continuously and which may in fact be present in a variety of different thermal environments. Since computer systems run continuously, so must their cooling systems unlike a normal household or similar refrigerator which is operated under a so-called bang-bang control philosophy in which the unit is alternating either totally on or totally off. Furthermore, since large computer systems experience, over the course of time, say hours, variations in user load and demand, the amount of heat which must be removed also varies over time. Therefore, a cooling unit or cooling module for a computer system must be able not only to operate continuously but also be able to adjust its cooling capability in response to varying thermal loads.

SUMMARY OF THE INVENTION

In accordance with a preferred embodiment of the present invention, an apparatus for cooling electronic circuits comprises a novel cold plate with a thermal interface to a plurality of conduction plates whereby each conduction plate transfers heat flux to the cold plate from its associated electronic circuit card. Each conduction plate is married to a single electronic card prior to being mounted on the cold plate. The conduction plate/electronic card pairs are then mounted perpendicular to and in parallel fashion onto the cold plate. The heat flux flows from the circuit card to the conduction plate and then into the cold plate. The cold plate has an internal cavity through which cold water is circulated to transfer the absorbed heat flux from the cold plate to a cooling system. The cold plate is shaped in a rectangular manner with a rectangular through-hole centrally located. As the conduction plate/electronic card pair is mounted onto the cold plate, one of the connectors mounted on the electronic card extends through the cold plate through-hole to mate with a matching connector. The cold plate through-hole is one of the essential novel elements that assists in rendering a compact design because it allows the cold plate to be in close proximity to all of the heat sources, i.e., the integrated circuits.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION OF THE INVENTION

Figure 1:
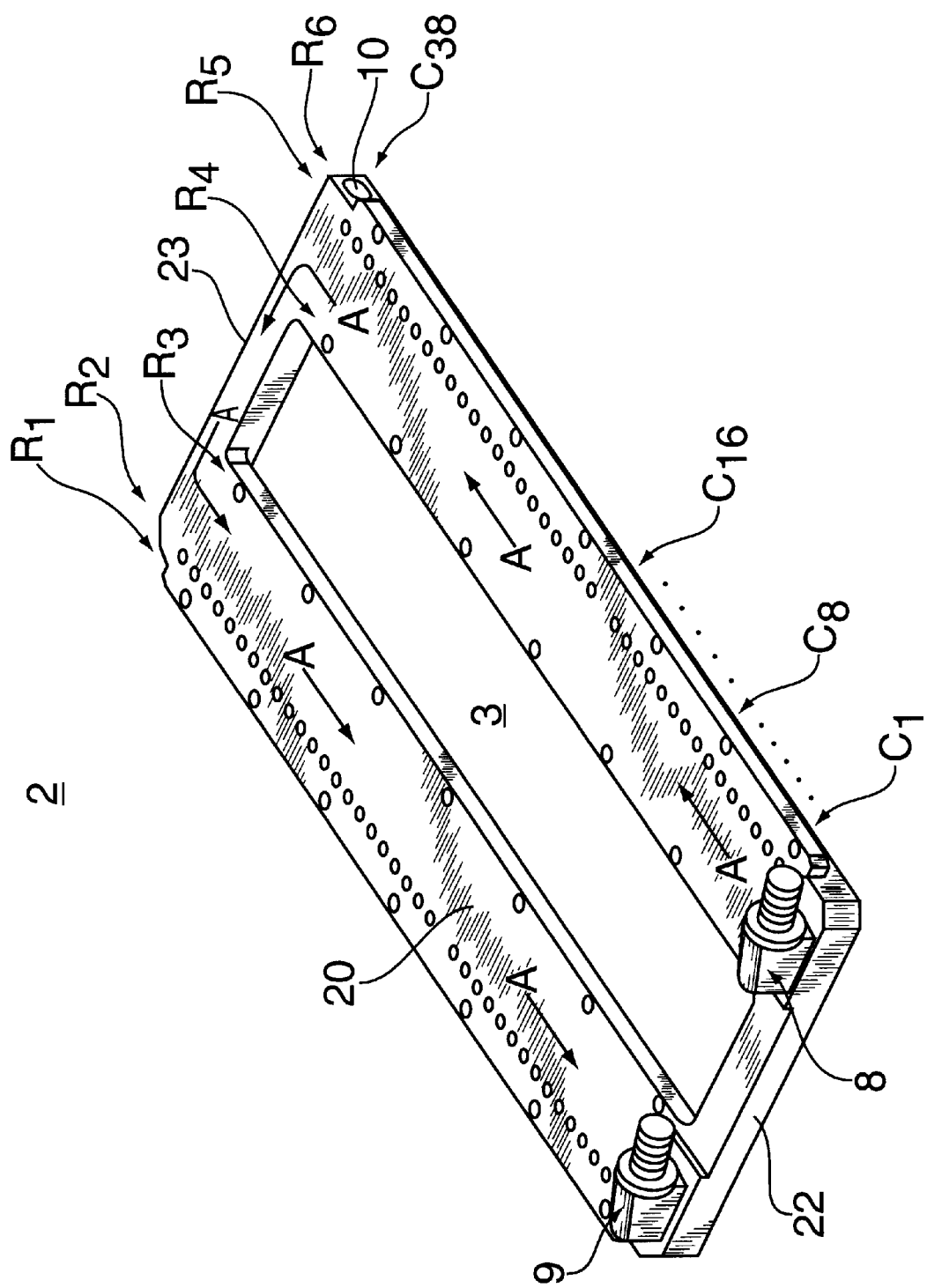
FIG. 1 is a perspective view of a cold plate illustrating the planar structure with a central through-hole and various mounting holes.

FIG. 1 is a perspective view of a cold plate 2 made from copper illustrating the planar structure with a large central through-hole 3. Input port 8 and output port 9 are mounted on the top surface 20 at a front end 22 of the cold plate 2. Cold water is fed from a cooling system (not shown) to input port 8. The cold water flows in an interior cavity 4 (see FIGS. 3, 4A & 4B) along path A to the rear end 23 of the cold plate 2, crosses over to the opposite side in cross-channel 10 and returns to the output port 9 in a similar interior cavity 4. Thus, any thermal energy transferred to the cold plate 2 is absorbed by the cold water and transported to the cooling system.

The cold plate 2 is mounted to an articulated test head platform (not shown) using the through-holes depicted in rows $R_1$, $R_3$, $R_4$ & $R_6$ The holes depicted in rows $R_2$ & $R_5$ are not through-holes but are in fact bottomed within the cold plate 2. These holes, $R_2$ & $R_5$, are used to mount the conduction plate feet 44 as shown later in FIG. 6.

Figure 2:
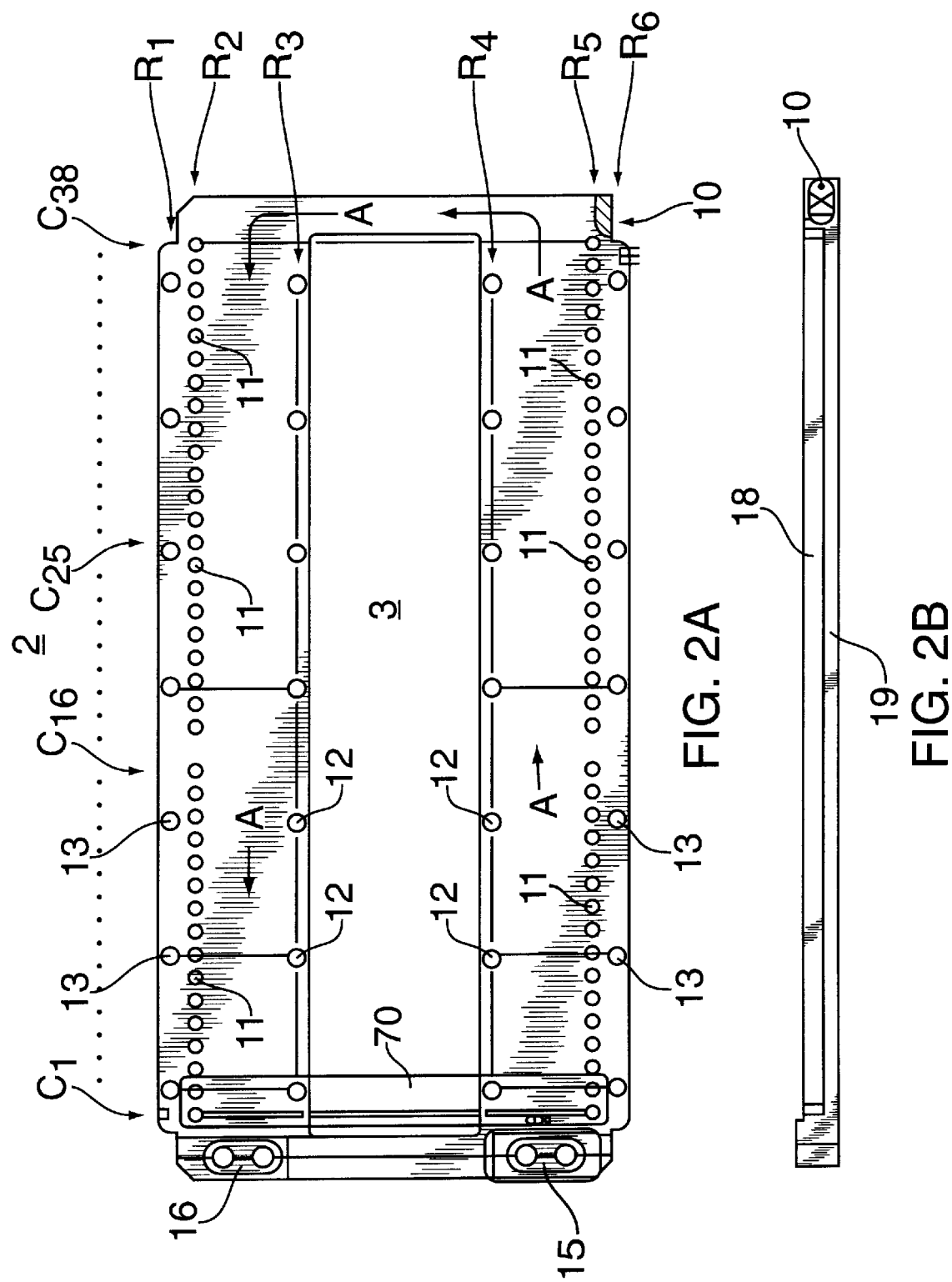
FIG. 2A is a top plan view of the cold plate illustrating a central through-hole, various mounting holes, including the lands for mounting the input and output port.
FIG. 2B is a side elevation view of the cold plate illustrating its planar structure.

FIG. 2A is a top plan view of the cold plate 2 illustrating a central through-hole 3, various mounting holes 1 1, 12 & 13 and the input and output landings 15 & 16 for mounting the respective input and output ports 8 & 9. The series of through-holes in rows $R_3$ & $R_4$ which surround the periphery of central through-hole 3, and the series of through-holes in rows $R_1$ & $R_6$ which lie near the periphery of the cold plate 2 are used to mount the cold plate 2 to the test head (not shown). The holes in rows $R_2$ & $R_5$ are for mounting conduction plate/electronic card pairs 70 as further described in reference to FIG. 6. There are 38 holes in each row $R_2$ & $R_5$ labeled columns C, through $C_{38}$. As can be seen in FIG. 2A, a conduction plate/electronic card pair 70 has been mounted in holes $R_2C_1$, $R_2C_2$, $R_5C_1$, & $R_5C_2$. In this manner nineteen (19) individual conduction plate/electronic pairs 70 can be mounted on each cold plate 2. A test head is usually comprised of four cold plates 2 so that a test head may have up to seventy-six conduction plate/electronic pairs 70 operating simultaneously.

FIG. 2B is a side elevation view of the cold plate illustrating its planar structure with a view of an opening to the cross-channel cavity 10. During manufacture the cross-channel cavity is bored and reamed into the cold plate 2 from the cold plate exterior side wall 19. The cross-channel connects the two interior cavities 4A & 4B to form one continuous cavity 4 throughout the cold plate 2. After the cross-channel cavity 10 has been machined, an appropriately sized end cap (see FIGS. 5A & 5B) seals the opening to the cross-channel cavity 10 on the cold plate exterior side wall 19. Mounting flange 18 extends beyond the exterior side wall 19 (protrudes out of the page) so that mounting bolts passing through mounting holes 13 (see FIG. 2A) can secure the cold plate 2 to the test head (not shown).

Figure 3:
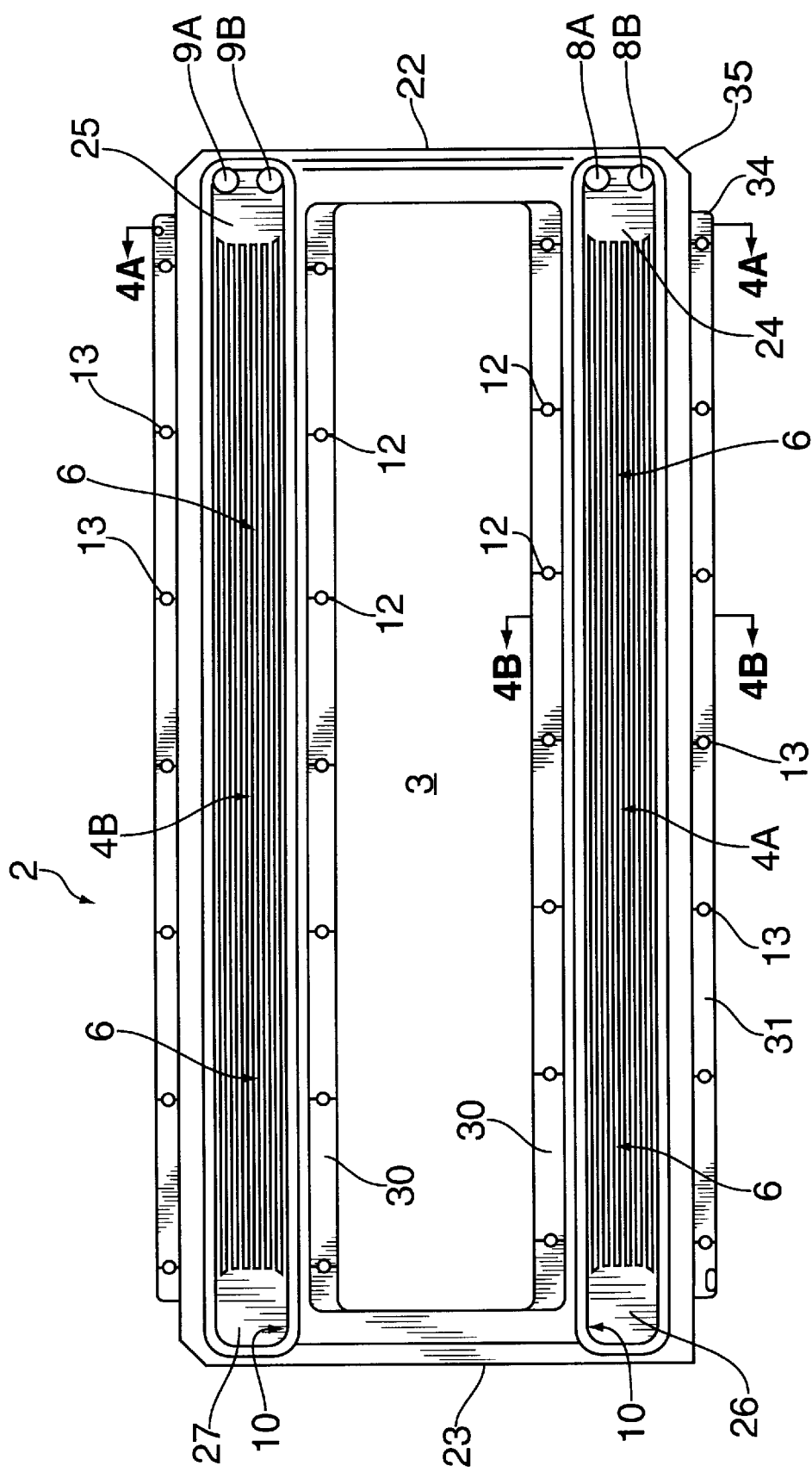
FIG. 3 is a bottom plan view of the cold plate without the closing covers illustrating fingers formed on an interior surface of a cavity.
Figure 4A:
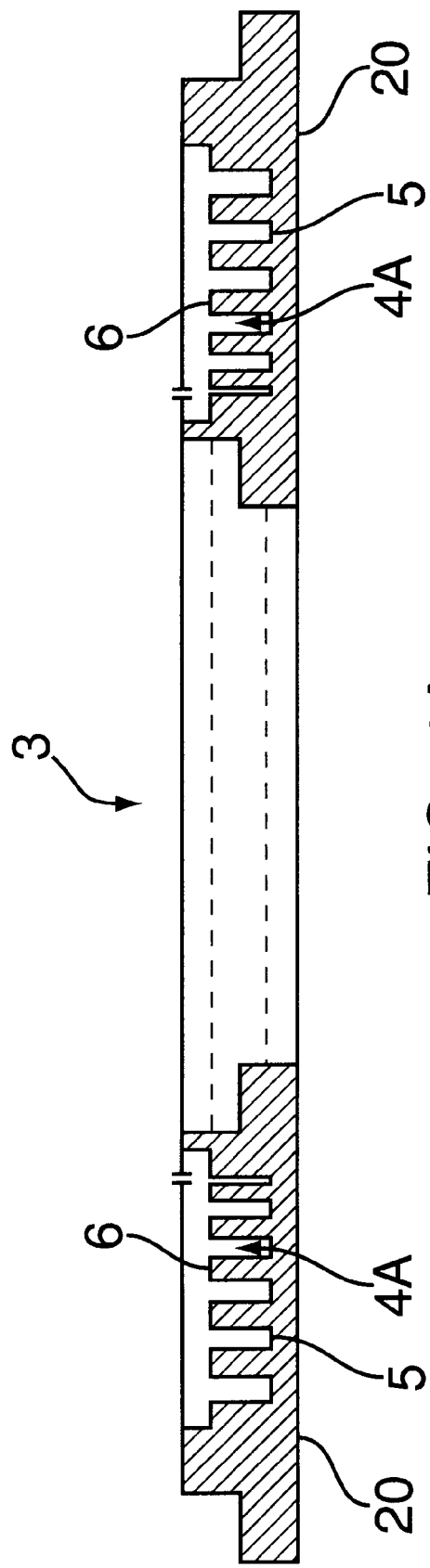
FIG. 4A is a cross sectional view of FIG. 3 taken at AA" illustrating the interior cavity of the cold plate-and the fingers projecting into the cavity.

Referring to FIG. 3, a bottom plan view of the cold plate 2 is shown. The two interior cavities 4A & 4B with their depending array of fingers 6 are illustrated as the cover plates 14 (see FIG. 4B) are not yet in place. The interior cavities 4A & 4B are machined into the cold plate 2 along two parallel paths, each extending from a respective interior cavity front end 24 & 25 to a respective interior cavity rear end 26 & 27 at a first depth. Next a CNC milling machine cuts deep grooves 50 and/or cross-cuts 52 into each cavity 4A & 4B (see FIGS. 4B & 4C) to define a plurality of fingers 6. However front ends 24 & 25 and rear ends 26 and 27 of the interior cavities 4A & 4B are fingerless. In their respective cavity front ends 24 & 25, through-holes 8A & 8B are bored to form the inlet port 8, and similarly through-holes 9A & 9B are bored to form the outlet port 9. The two cavities 4A & 4B are connected within the cold plate 2 by a cross-channel 10 bored into the plate 2 from a side edge as discussed above. The cold plate fluid path A begins at the inlet through-holes 8A & 8B flowing into the inlet cavity front end 24, continues through the fingers 6 of inlet cavity 4A to rear end 26, traverses the cold plate 2 through the cross-channel 10 to rear end 27, continues along outlet cavity 4B to front end 25, and exits the cold plate 2 at the outlet through-holes 9A & 9B. It Referring to FIG. 4A, a cross sectional view of FIG. 3 taken at AA" is shown. The fingers 6 are illustrated in the inlet interior cavity 4A and the outlet interior cavity 4B. It should be observed that the fingers 6 are machined into the cold plate 2 so that their base 7 (see FIG. 4B) is connected to that portion of the interior cavity surface 5 which is directly under the cold plate top surface 20. Thus when the conduction plate feet 44 are mounted onto the cold plate top surface 20, there is a very short path of low thermal resistance between the conduction plate feet 44 and the cold plate fingers 6. This assures a very high thermal conductance between the conduction plate and the cold water flowing through the cold plate fingers 6 allowing very efficient heat flow from the integrated circuits to the cooling system.

Figure 4B:
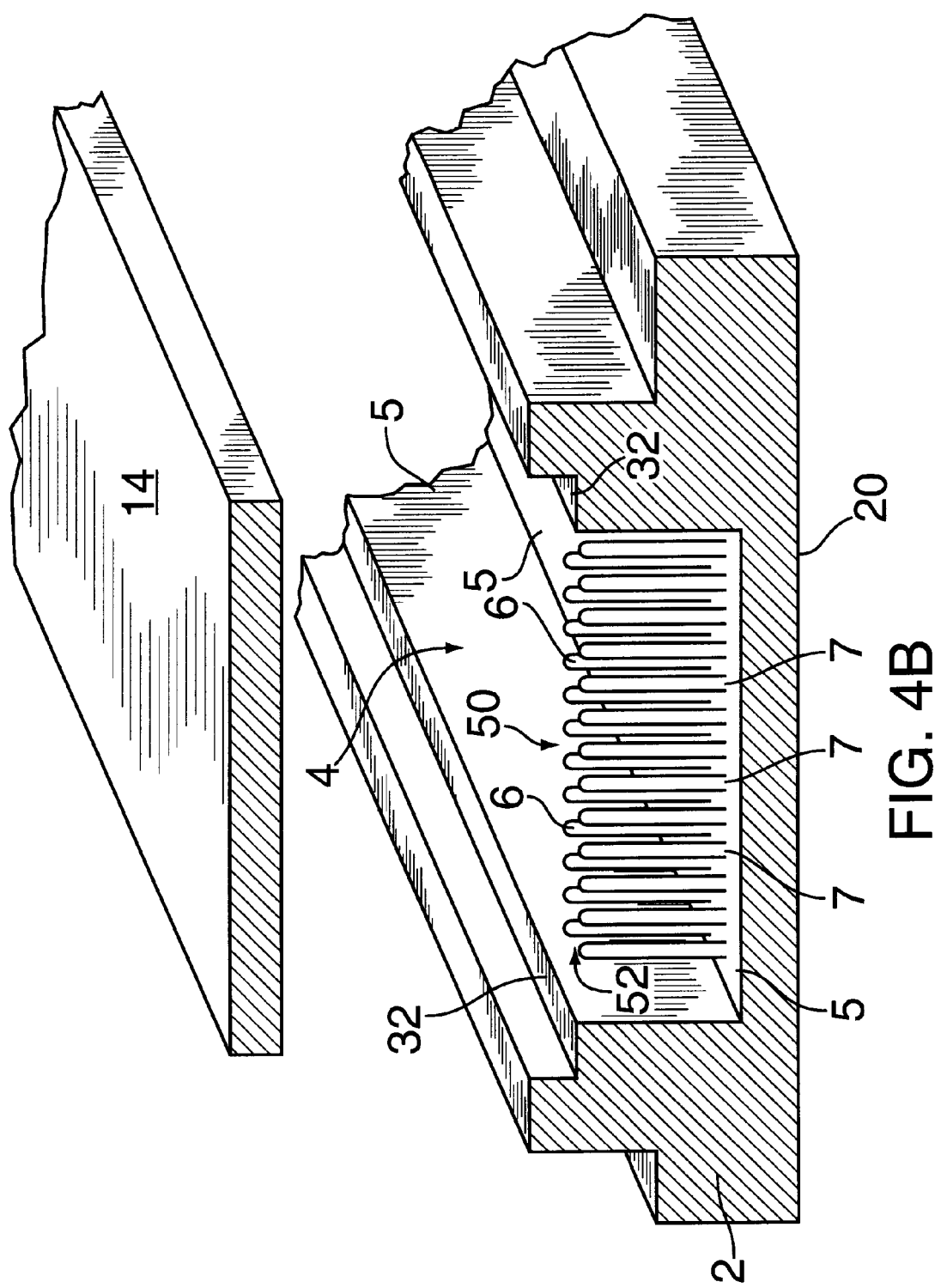
FIG. 4B is a cross sectional perspective view of FIG. 3 taken at BB" illustrating a first embodiment of the interior cavity of the cold plate and the fingers projecting into the cavity.

Referring to FIG. 4B, a first embodiment of a cross sectional perspective view of the cold plate 2 in FIG. 3 taken at BB" is shown with a cover plate 14 in near proximity. Only the first two rows of fingers 6 are shown but it should be noted that the rows of fingers 6 extend completely throughout the inlet cavity 4A and the outlet cavity 4B excepting their respective front ends 24 & 25 and rear ends 26 & 27. Chilled water flows along the interior cavities 4A & 4B in the grooves 50 and cross-cuts 52 absorbing thermal energy from the surface area of each finger 6.

Figure 4C:
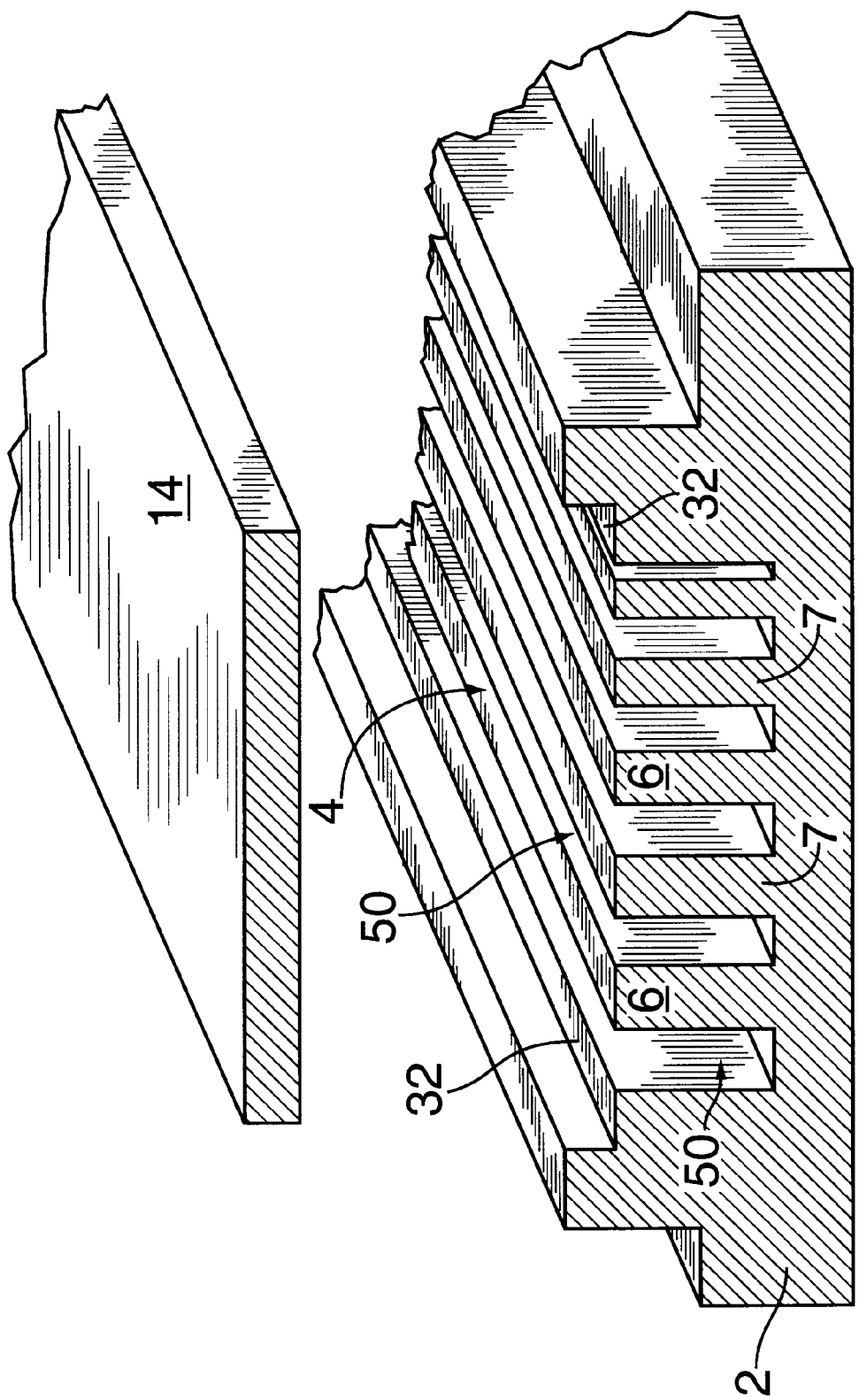
FIG. 4C is a cross sectional perspective view of FIG. 3 taken at BB" illustrating a second embodiment the interior cavity of the cold plate and the fingers projecting into the cavity.

Referring to FIG. 4C, a second embodiment of a cross sectional perspective view of the cold plate 2 in FIG. 3 taken at BB" is shown with a cover plate 14 in near proximity. In this embodiment only longitudinal grooves 50 are cut by the milling machine along the interior cavity 4. Chilled water flows along the interior cavities 4A & 4B in the grooves 50 absorbing thermal energy from the finger sidewalls. Each interior cavity 4A & 4B is sealed by metallurgically bonding cover plates 14 onto shoulders 32 which will form an air-tight cavity from their respective front ends 24 & 25 to their respective rear ends 26 & 27.

Figure 5C:
FIG. 5C is a side elevation view of a cover plate which attaches to the cold plate to seal an interior cavity.
Figure 5D:
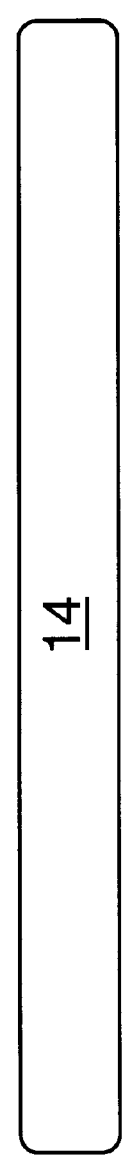
FIG. 5D is a top plan view of a cover plate which attaches to the cold plate to seal an interior cavity.
Figure 5A:
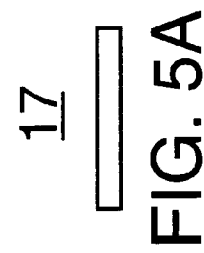
FIG. 5A is a side elevation view of a cross-channel end cap which attaches to the cold plate to seal the cross-channel cavity.

Referring to FIG. 5A, a side elevation view of a cross-channel end cap 17 which attaches to the cold plate exterior side wall 19 to seal the cross-channel cavity 10 is shown. The end cap 17 sits in a shoulder circumferentially cut around the opening to the cross-channel cavity 10 on the cold plate side wall 19. The end cap 17 is metallurgically bonded to the shoulder to provide an air-tight seal.

Figure 5B:
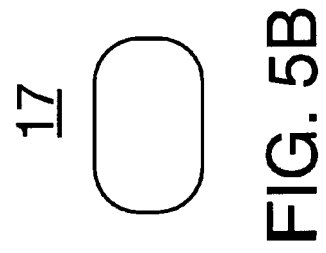
FIG. 5B is a top plan view of a cross-channel end cap which attaches to the cold plate to seal the cross-channel cavity.

Referring to FIG. 5B, a top plan view of a cross-channel end cap 17 which attaches to the cold plate side wall 19 to seal the cross-channel cavity 10 is shown. The oval shape and dimensions of the end cap 17 match the circumferential shoulder cut into the cold plate side wall 19.

Referring to FIG. 5C, a side elevation view of a cover plate 14 is shown. A first cover plate 14 seals interior cavity 4A while a second cover plate 14 seals interior cavity 4B (see FIG. 3). Each cover plate 14 sits in a respective shoulder 32 circumferentially cut around each opening of interior cavities 4A and 4B on the cold plate bottom surface 21. Each cover plate 14 is metallurgically bonded to its respective shoulder to provide an air-tight seal for its respective cavity 4A and 4B.

Referring to FIG. 5D, a top plan view of a cover plate 14 is shown. The rounded corners and peripheral dimensions of the cover plate 14 match the circumferential shoulder 32 cut into the cold plate bottom surface 19 around each interior cavity 4A and 4B.

Figure 6:
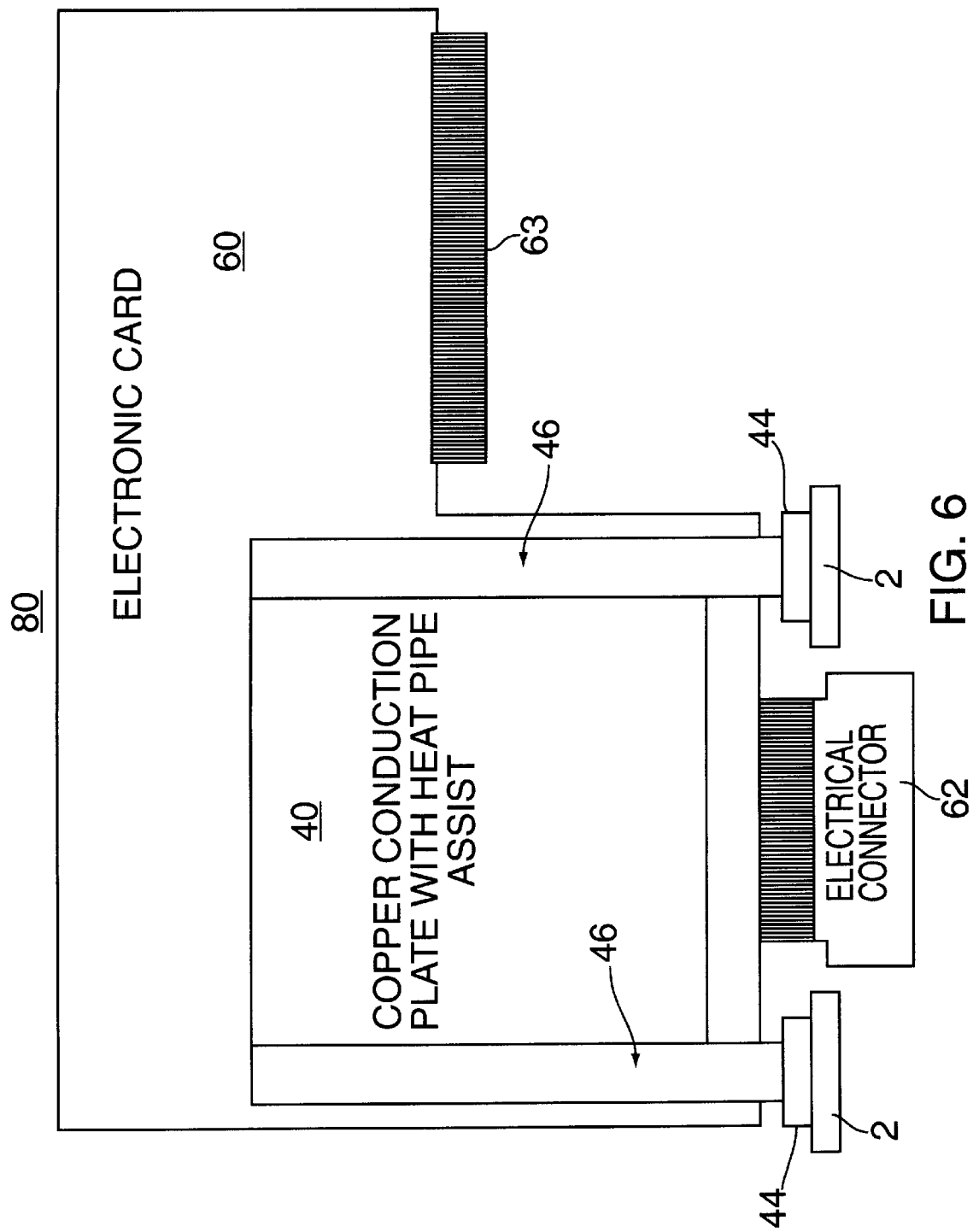
FIG. 6 is a side elevation view of the cold plate assembly illustrating the electronic card/conduction plate pair mounted on top of the cold plate.

Referring to FIG. 6, a side elevation view of a cold plate assembly 80 is shown. An electronic card 60 is mated to its copper conduction plate 40 and the conduction plate 40 is maintained in direct thermal contact with the integrated circuits (not shown) mounted on the electronic card 60. The conduction plate 40 has two feet 44, each of which is bolted to the cold plate 2 such that each foot 44 is mounted directly on top of an interior cavity 4 on the top surface 20 of the cold plate 2. Thermal energy generated by the integrated circuits flows to the conduction plate 40, disperses across the copper plate 40 to either of two heat pipes 46 and then downward to the conduction plate feet 44. The heat flux next flows from the feet 44 into the cold plate fingers 6 where it is transferred to the cold water stream and conducted out to the cooling system. Given that only one conduction plate/electronic card pair 70 is shown in this view, it should be noted that each cold plate 2 mounted on the test head can hold up to nineteen conduction plate/electronic card pairs 70 each.

Each electronic card 60 has a first electrical connector 62 and a second electrical connector 63. The first electrical connector 62 of each card 60 mates with a matching test head connector (not shown) which rises up through the cold plate central through-hole 3. The cold plate through-hole 3 allows the cold plate 2 to enjoy close proximity to the integrated circuits mounted on the electronic card 60 providing a path of high conductance for the thermal energy to be dissipated thus lowering the volume requirement of the test head assembly while increasing the thermal efficiency of the cold plate simultaneously.

Figure 7A:
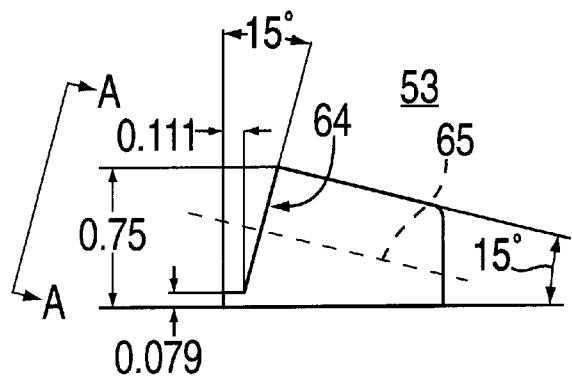
FIG. 7A is a side elevation view of a port housing which mounts on the cold plate to form either an inlet port or an outlet port.

Referring to FIG. 7A, a side elevation view of a port housing 53 which mounts on the cold plate 2 to form either an inlet port 8 or an outlet port 9 is shown. The front face 64 of the port housing 53 is preferably angled back 15° to allow the axis 65 of the nipple aperture 54 to also be preferably elevated 15°. This enhances an operator's ability to make and break the cooling conduit connections at the input 8 and output 9 ports.

Figure 7B:
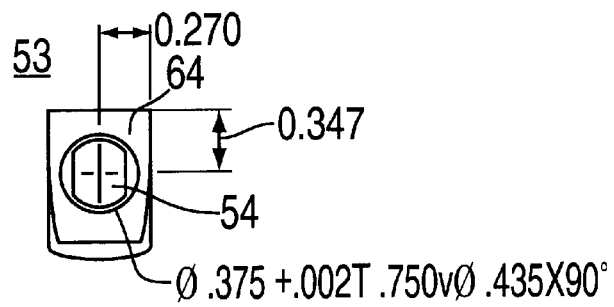
FIG. 7B is a perspective view of FIG. 7A taken at line AA illustrating the opening in which a quick disconnect nipple is mounted.

Referring to FIG. 7B, a perspective view of FIG. 7A taken at line AA illustrating the port housing's front face 64 is shown. The nipple aperture 54 is preferably elevated 15° from horizontal. The port end 58 of the quick disconnect nipple 57 will be pressed into the nipple aperture 54 to form an air-tight fitting.

Figure 7C:
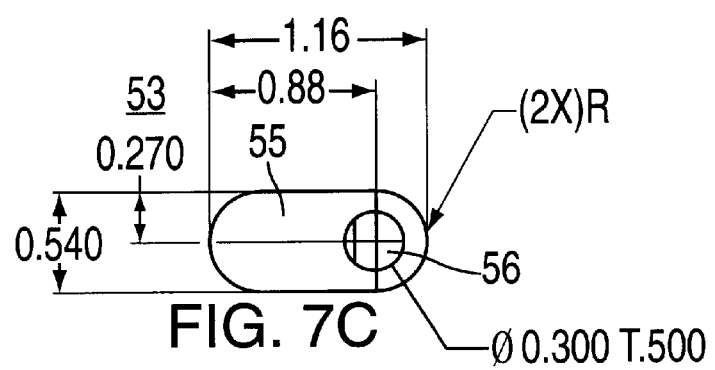
FIG. 7C is a bottom plan view of a port housing bottom surface which mounts on the cold plate.

Referring to FIG. 7C, a bottom plan view of a port housing 53 is shown. A flow port 56 is formed on the bottom surface 55 of the port housing 53 and is in fluid communication with the nipple aperture 54 on the front face 64. When the port housing 53 is mounted on the cold plate input port landing 15 or the output port landing 16, an air-tight fluid path is provided from the nipple aperture 54 to the interior cavities 4A or 4B of the cold plate 2.

Figure 7D:
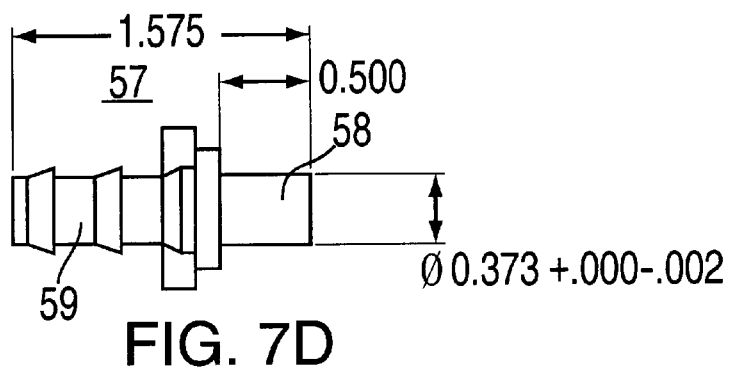
FIG. 7D is a side elevation view of a quick disconnect nipple which mounts in the port housing on the cold plate.

Referring to FIG. 7D, a side elevation view of a quick disconnect nipple 57 is shown. The port end 58 is pressed into the nipple aperture 54 of the port housing 53 to provide an air-tight connection. The quick disconnect fitting 59 of the nipple 57 thereafter protrudes at a preferably upward angle of 15° so that input and output coolant conduits may be attached to the cold plate 2.

From the above, it should be appreciated that the systems and apparatus described herein provide a reliable redundant cooling system for computer and other electronic systems. It should also be appreciated that the cooling systems of the present invention permit the operation of computer systems at increased speeds. It should also be appreciated that the objects described above have been filled by the systems and methods shown herein particularly with respect to the utilization of a cold plate having dual flow-wise isolated but thermally coupled passages.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A cold plate for absorbing thermal energy comprising:

an essentially rectangular planar body having a first end, a second end, an input member, and an output member, said members extending between and connected to said ends;

said ends essentially disposed parallel to each other and said members essentially disposed parallel to each other, said ends disposed essentially perpendicular to said members;

said ends and members further disposed so as to form a central through-hole extending from a top surface of said planar body to a bottom surface of said planar body;

each of said second end and said members having a respective interior cavity bounded by a respective interior surface;

said input member interior cavity being in fluid communication with said second end interior cavity, and said second end interior cavity being in fluid communication with said output member interior cavity;

whereby a fluid path is formed from said input member cavity through said second end cavity to said output member cavity and said path is essentially a U-shaped path;

an input port mounted on said first end and said input port in fluid communication with said input member interior cavity; and an output port mounted on said first end and said output port in fluid communication with said output member interior cavity;

whereby said input port is in fluid communication with said output port through said respective interior cavities forming said essentially U-shaped fluid path.

2. A cold plate for absorbing thermal energy as in claim 1 and further comprising:

an input member plate, an output member plate, and a second end plug;

said input member plate being removably mounted to said input member so as to provide access to said input member interior cavity, said output member plate being removably mounted to said output member so as to provide access to said output member interior cavity; and said second end plug being removably mounted to said second end so as to provide access to said second end interior cavity.

3. A cold plate for absorbing thermal energy as in claim 1 and further comprising:

a set of fins emanating from each of said members interior surface into said respective members interior cavity; and each said set of fins being formed integral to said respective interior surface.

4. A cold plate for absorbing thermal energy as in claim 1 and further comprising:

a set of fingers emanating from each of said members interior surface into said respective members interior cavity; and each said set of fingers being formed integral to said respective interior surface.

5. A cold plate for absorbing thermal energy as in claim 1 and further comprising:

a first conduction plate having two heat pipes, each said pipe mounted on an opposing edge of said conduction plate, and each of said pipes extending away from said conduction plate in an essentially parallel manner to a respective distal end;

each of said heat pipes each having a foot at each respective said distal end; and said feet spaced apart so that one said foot is disposed to mount on said top surface of said input member of said planar body; and the other said foot is disposed to mount on said top surface of said output member of said planar body.

6. A cold plate for absorbing thermal energy as in claim 1 whereby said members are dimensionally longer than said ends.

7. A cold plate for absorbing thermal energy as in claim 1 whereby a cross-sectional area of said central through-hole taken in the plane of said planar body is greater than 25% of the total area occupied by said planar body.

8. A cold plate for absorbing thermal energy as in claim 5 whereby:

said feet provide thermal communication between the said cold plate and said heat pipes.

9. A cold plate for absorbing thermal energy as in claim 5 whereby:

said first conduction plate includes a thermal mass wherein each said heat pipe provides a thermal path between a portion of said thermal mass and said respective foot.

10. A cold plate for absorbing thermal energy as in claim 5 further comprising:

a first electronic circuit card having at least one electronic component and at least one electrical connector mounted on said first card:

said first conduction plate mechanically fixed to said first card forming a first conduction/card assembly and wherein said at least one electronic component is in thermal communication with said first conduction plate;

wherein said thermal energy flows from said electronic component to said planar body.

11. A cold plate for absorbing thermal energy as in claim 10 and further comprising a plurality of said conduction/card assemblies are mounted on said cold plate, adjacent to each other;

each respective one of said plurality of conduction/card assemblies having its respective said feet in thermal communication with said first cold plate;

wherein said first cold plate simultaneously absorbs thermal energy from each said conduction/card assembly.

12. A cold plate for absorbing thermal energy as in claim 1 wherein said rectangular body is dimensionally at least ten times longer than it is thick.

13. A method for absorbing thermal energy comprising:

providing a cold plate having an essentially rectangular planar body including a first end, a second end, an input member, and an output member, extending and connecting said members between said ends;

disposing said ends essentially parallel to each other and disposing said members essentially parallel to each other, disposing said ends essentially perpendicular to said members;

further disposing said ends and members so as to form a central through-hole extending from a top surface of said planar body to a bottom surface of said planar body;

providing each of said second end and said members a respective interior cavity bounded by a respective interior surface;

connecting said input member interior cavity with said second end interior cavity so as to provide fluid communication between said cavities, and connecting said second end interior cavity with said output member interior cavity so as to provide fluid communication between said cavities;

whereby a fluid path is provided from said input member cavity to said output member cavity, and said path is essentially a U-shaped path;

providing an input port on said first end and connecting said input port in fluid communication with said input member interior cavity; and providing an output port mounted on said first end and connecting said output port in fluid communication with said output member interior cavity;

whereby said input port is provided fluid communication with said output port through said respective interior cavities providing said essentially U-shaped fluid path.

14. A method for absorbing thermal energy as in claim 13 and further comprising:

providing an input member plate, an output member plate, and a second end plug;

mounting said input member plate to said input member so as to seal access to said input member interior cavity;

mounting said output member plate to said output member so as to seal access to said output member interior cavity; and mounting said second end plug to said second end so as to seal access to said second end interior cavity.

15. A method for absorbing thermal energy as in claim 13 and further comprising:

providing a set of fins emanating from each of said members interior surface into said respective members interior cavity; and forming each said set of fins integral to said respective interior surface.

16. A method for absorbing thermal energy as in claim 13 and further comprising:

providing a set of fingers emanating from each of said members interior surface into said respective members interior cavity; and forming each said set of fingers integral to said respective interior surface.

17. A method for absorbing thermal energy as in claim 13 and further comprising:

providing a first conduction plate having two heat pipes, mounting each said pipe on an opposing edge of said conduction plate, and extending each of said pipes away from said conduction plate in an essentially parallel manner to a respective distal end;

providing each of said heat pipes with a foot at each respective said distal end; and spacing said feet apart so that one said foot is disposed to mount on said top surface of said input member of said planar body; and spacing the other said foot to mount on said top surface of said output member of said planar body.

18. A method for absorbing thermal energy as in claim 13 further comprising:

dimensioning a cross-sectional area of said central through hole taken in the plane of said planar body to be greater than 25% of the total area occupied by said planar body.

19. A method for absorbing thermal energy as in claim 17 further comprising:

providing a first electronic circuit card having at least one electronic component and at least one electrical connector mounted on said first card; and mechanically fixing said first conduction plate to said first card forming a first conduction/card assembly and wherein said at least one electronic component is in thermal communication with said first conduction plate;

wherein said thermal energy flows from said electronic component to said planar body.

20. A method for absorbing thermal energy as in claim 13 and further comprising mounting a plurality of said conduction/card assemblies on to said cold plate, adjacent to each other; and positioning each respective one of said plurality of conduction/card assemblies so as to have its respective said feet in thermal communication with said first cold plate;

wherein said first cold plate simultaneously absorbs thermal energy from each said conduction/card assembly.

* * * * *

UNITED STATES PATENT AND TRADEMARK OFFICE
CERTIFICATE OF CORRECTION

PATENT NO. : 6,058,010
DATED : May 2, 2000
INVENTOR(S) : Roger R. Schmidt et al.

It is certified that error appears in the above-identified patent and that said Letters Patent is hereby corrected as shown below:

Column 3,
Line 28, after "cold" delete "plate-and" insert therefor -- plate and --

Column 4,
Line 28, after "columns" delete "C," and insert -- $C_1$ --

Signed and Sealed this

Sixteenth Day of December, 2003

JAMES E. ROGAN
*Director of the United States Patent and Trademark Office*